United States Patent [19]

Wise

[11] 4,305,010
[45] Dec. 8, 1981

[54] EXCESSIVE DUTY CYCLE AND PULSE WIDTH LIMITER

[75] Inventor: Philip S. Wise, Northridge, Calif.

[73] Assignee: The United States of America as represented by the Secretary of the Army, Washington, D.C.

[21] Appl. No.: 69,022

[22] Filed: Aug. 23, 1979

[51] Int. Cl.³ .................... H03K 3/03; H03K 3/017
[52] U.S. Cl. ................................. 307/270; 307/255; 307/265
[58] Field of Search ............... 307/265, 255, 270, 310, 307/313

[56] References Cited
U.S. PATENT DOCUMENTS 3,374,361  3/1968  Callis .................................. 307/310
3,747,082  7/1973  Ottenstein ........................... 307/270
4,002,927  1/1977  Nakamura et al. .................. 307/270

OTHER PUBLICATIONS

EEE Magazine, Duty Cycle Limiter by C. Samocki, 9/65, p. 76.

Primary Examiner—Stanley D. Miller, Jr.
Assistant Examiner—B. P. Davis
Attorney, Agent, or Firm—Nathan Edelberg; Robert P. Gibson; Freddie M. Bush

[57] ABSTRACT

An excessive duty cycle and pulse width limiter comprises two constant current sources responsive to changes in a control input signal to provide a constant voltage charge and discharge current to a capacitor whose voltage level is sensed by a tripping circuit. The circuit effectively measures duty cycle and is used as a protective limiter, providing output pulse blanking signals to load circuitry.

5 Claims, 2 Drawing Figures

EXCESSIVE DUTY CYCLE AND PULSE WIDTH LIMITER

DEDICATORY CLAUSE

The invention described herein was made in the course of a contract with the Government and may be manufactured, used, and licensed by or for the Government for governmental purposes without the payment to me of any royalties thereon.

SUMMARY OF THE INVENTION

The present invention is directed to an excessive duty cycle and pulse width limiter circuit. A drive control for the circuit, in response to a control input signal, drives two high speed switches which alternately energize two constant current generators for charging and discharging a capacitive load within a control ortripping circuit. The capacitor voltage level is sensed by a detector within the trip circuit for terminating voltage supply to the load in the event that the duty cycle of the load is exceeded. The circuit effectively measures the load duty cycle and functions as a protective limiter by providing output pulse blanking signals, thereby terminating output voltage to the load until the capacitor charge signal is restored to normal.

DESCRIPTION OF THE PREFERRED EMBODIMENT

Figure 1:
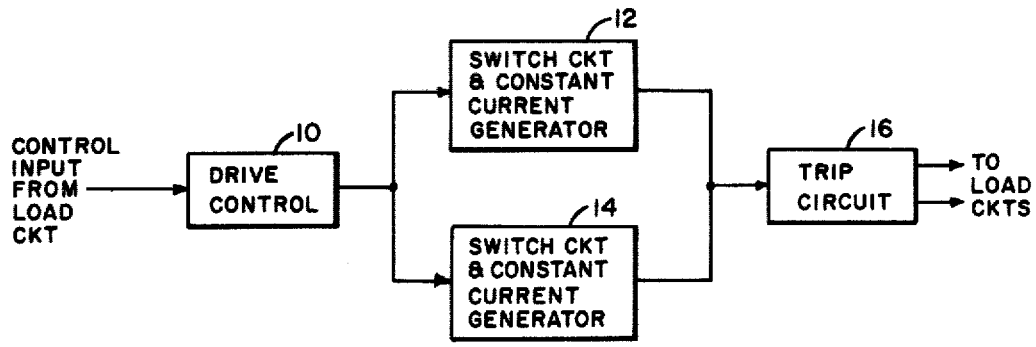
FIG. 1 is a block diagram of a preferred embodiment of the excessive duty cycle and pulse width limiter circuit.

Referring now to the drawings wherein like numerals represent like parts, FIG. 1 discloses a block diagram of the excessive duty cycle and pulse width limiter wherein a drive control circuit 10 is adapted to receive a control input signal from a load or driving circuit and provides an output signal to respective high speed switch and current generator circuits 12 and 14. Output signals from the constant current generators of circuits 12 and 14 are supplied in common to the trip circuit 16. Output signals from trip circuit 16 to load or controlled circuits remain constant until the trip circuit senses an abnormal change in the input circuit, at which time the output is limited until a normal condition is sensed by trip circuit 16.

Figure 2:
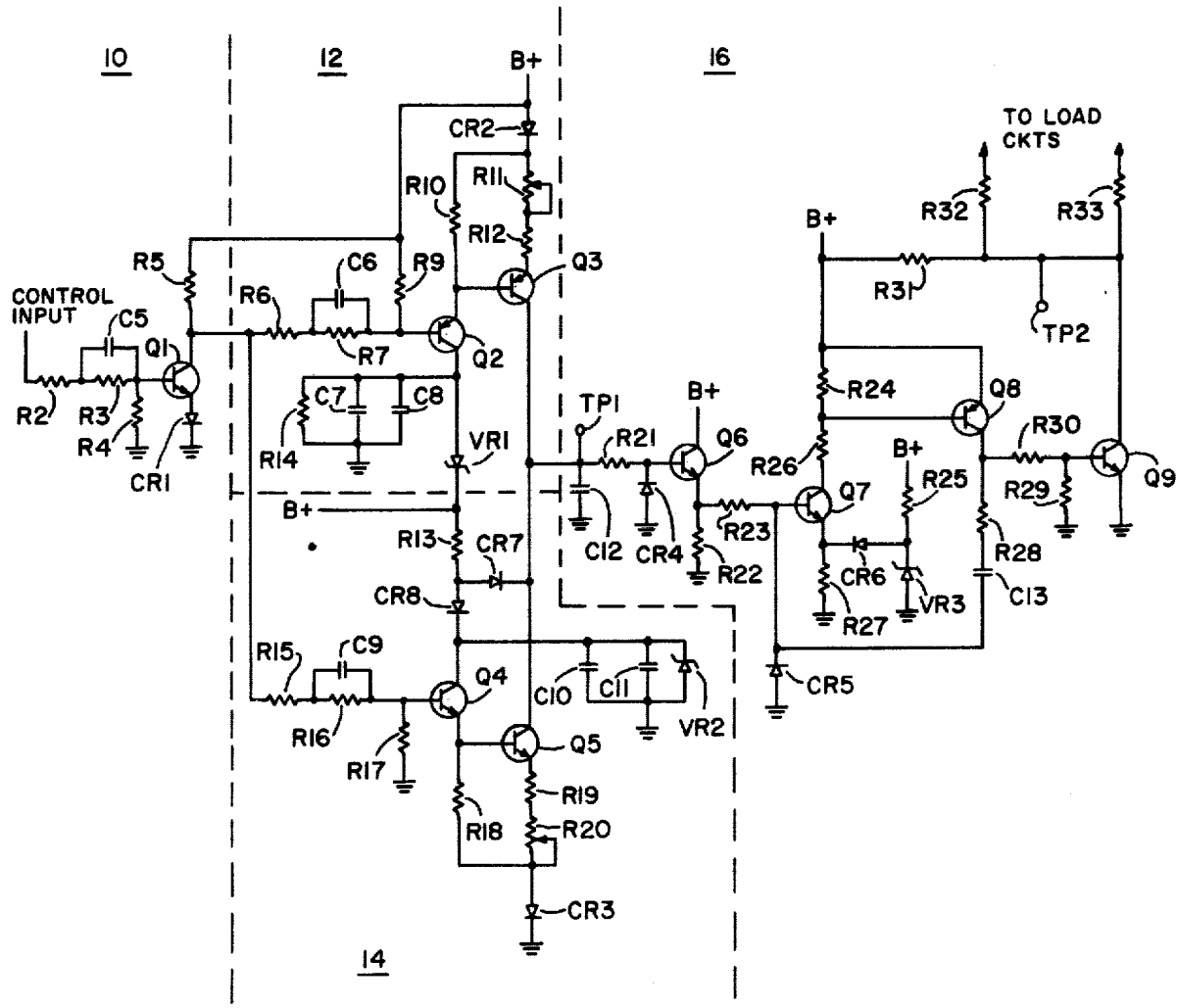
FIG. 2 is a schematic diagram of the circuit of FIG. 1 with extraneous circuit elements omitted.

As shown in the schematic of FIG. 2, drive control 10 comprises a NPN transistor Q1. The emitter of Q1 is coupled through a diode CR1 to ground and the base is coupled to receive the control input signal through a resistance R2 coupled in series with a parallel resistance-capacitance network comprising resistor R3 and capacitor C5. A resistance R4 is coupled between the base of Q1 and ground. A power source (not shown) B+ is coupled through a resistance R5 to the collector of Q1. Switching circuit and constant current generator 12 includes PNP transistor Q2 providing high speed switching for PNP transistor Q3 which is coupled as a current source. Similarly, switching circuit and constant current generator 14 includes NPN transistor Q4 to provide the high speed switching for NPN transistor Q5 which functions as the constant current source. The collector of Q1 is coupled through a resistance R6 in series with parallel coupled capacitor C6 and resistor R7 to the base of Q2. Supply voltage B+ is further coupled through a resistor R9 to the base of Q2, while the emitter of Q2 is coupled through a resistance R10 and in the reverse direction through a diode CR2 to the supply voltage B+. The collector of Q2 is connected to ground through a parallel arrangement of resistor R14, capacitor C7, and capacitor C8. In a similar manner, transistor Q4 is adapted for switching action, being coupled to receive the switching signal from the collector of Q1 through resistor R15 in series with the parallel connected capacitor C9 and resistor R16 to the base of Q4. The base of Q4 is further connected through a resistor R17 to ground and the collector of Q4 is connected to ground through a parallel combination of capacitor C10, capacitor C11 and zener diode VR2 which functions as a voltage regulator. The emitter of Q4 is connected through a resistor R18 and in the forward direction through a diode CR3 to ground. Transistor Q3 has the base directly coupled to the emitter of Q2, and the emitter coupled in series through a resistor R12 and potentiometer or variable resistance R11 to the cathode of CR2. The NPN transistor Q5 has the base connected directly to the emitter of Q4, and the emitter connected in series through a resistor R19 and a potentiometer or variable resistance R20 to the anode of CR3. The collectors of Q3 and Q5 are connected together providing the input to trip circuit 16. The B+ supply voltage for Q4 and Q5 is supplied through resistor R13 to the anodes of diodes CR7 and CR8, the cathode of CR7 being coupled to the collector of Q5 and the cathode of CR8 being coupled to the collector of Q4. The reference voltage B+ is further coupled in the reverse direction through a zener diode VR1 to the collector of Q2.

The trip circuit 16 input from the collectors of Q3 and Q5 is developed across a capacitor C12 to ground. Capacitor C12 is further coupled through a resistor R21 to the base of NPN transistor Q6 and in the reverse direction through a diode CR4 to ground, such that the input signal from Q3 or Q5 developed across C12 is further coupled to the base of Q6. The collector of Q6 is connected to B+ and the emitter is connected through a resistance R22 to ground and through a resistance R23 to the base of an NPN transistor Q7. The base of Q7 is further coupled in the reverse direction through a diode CR5 to ground. B+ is supplied through a resistor R24 in series with resistor R26 to the collector of Q7, and the emitter of Q7 is connected through a resistor R27 to the ground. The emitter of Q7 is further coupled in the reverse direction through a diode CR6 and a resistor R25 to B+. The junction between R25 and the anode of CR6 is connected in the reverse direction through a zener diode VR3 to ground providing voltage regulation for Q7. A PNP transistor Q8 has the emitter coupled to B+ and the base coupled to the junction of R24 and R26. The collector of Q8 is connected in series through a resistance R28 and a capacitor C13 to the base of Q7 for providing feedback. The output of trip circuit 16 is provided by a transistor Q9 which has the emitter coupled to ground, the base coupled through a resistor R29 to ground and through a resistor R30 to the collector of Q8. The collector of Q9 is coupled through a resistance R31 to B+. The supply voltage B+ is further coupled through a resistor R32 to provide load circuit voltage and through a resistor R33 to provide load circuit voltage. When Q9 is activated the supply voltage to the load circuits is effectively removed from the load and passed through Q9 to ground.

The control input signal, indicative of the duty cycle of the load or controlled circuit, may come from a flip flop or bistable trigger circuit such as a Schmitt trigger, or other appropriate means for changing the state of Q1 in response to changing conditions in a controlled circuit such as a signal generator or synchronizer. Fast rise and fall times are required to provide an accurate duty cycle representation when small pulse widths are being monitored. Therefore high speed transistors are utilized in the high speed circuits of Q1-Q5 while slower, higher powered transistors are utilized for the output fault signal (Q6-Q9) which does not require speed.

The input circuit of R2, R3, and C5 for Q1 provides R-C speedup of the signal coupled to the circuit and diode CR1 provides reverse base current protection for the emitter of Q1 for reverse burn-out protection. The output of Q1 is split to provide drive control to the charge circuit 12 and discharge circuit 14 which operate identically except for polarity. Both circuits contain R-C speedup circuits, the R7-C6 circuit enhancing the on time for Q2 of the charge circuit and R16-C9 initiating rapid on time for the discharge circuit of Q4. Q2 and Q4 operate as high speed saturated switches to alternately connect a reference voltage to their respective constant current generators Q3 and Q5. The reference voltage is obtained for Q3 from the zener diode VR1 and resistor R14, and for Q5 from the zener diode VR2 and CR8 and R13. The capacitors C7-C8 and C10-C11 function as DC filters directly connected to the switch collectors.

Both constant current generator circuits are temperature compensated in an identical fashion. Typical of the two circuits, the Q5 circuit has the following compensation. VR2 and CR3 have a negative temperature variation of about 2 millivolts per degree centigrade which tends to compensate the voltage across the Q4 collector to CR3 anode to yield no temperature variation. The Q4 collector-emitter junction has a positive coefficient while Q5 base-emitter is negative with approximately the same value which therefore tends to keep the R19-R20 voltage constant with temperature changes and thereby provide a constant Q5 collector current when this switching is on. CR3, in addition to its compensating function, acts as a reverse base current limiter for Q4 in a similar manner as the input circuit (CR1). Similarly, VR1 and CR2 provide the negative temperature regulation for charge circuit 12.

In trip circuit 16, capacitor C12 is the duty cycle averaging element, Q6 is the high input impedance amplifier, Q7 is the trip circuit level detector with VR3 and CR6 providing the reference level for Q7. The base-emitter temperature compensation for Q7 is provided by CR6 which is connected to temperature compensated reference zener diode VR3. Temperature compensation for Q6 is provided by VR2, CR8, and CR7. This is accomplished by supplying a temperature varying steady state level at the Q6 base which decreases with temperature by the same amount as the base-emitter junction. The varying level is obtained from the CR7 cathode and temperature varying voltage on the series supply of CR8-VR2. Diode CR4 is utilize as a leakage current sink for Q6 base-collector leakage current, since the impedences are high and the voltage shift cannot be tolerated.

The trip circuit output amplifier is composed of transistors Q8 and Q9 with resistor capacitor network R28-C13 providing feedback to Q7 to obtain an effective hysterisis output to guarantee a minimum pulse width output pulse signal. Diode CR5 is used as a reverse base clamp for Q7 due to the high circuit impedences. Variable resistors R11 and R20 provide the required adjustments for the two different settings of the charging and discharging current generator circuits. Pulse width limiting is obtained by proper adjustment of R11, of the charging circuit. Duty cycle limiting is obtained by the proper adjustment of R20 of the discharge circuit and depends on the setting of R11. Decreasing the value of R11 decreases the charge time for capacitor C12, decreasing the value of R20 decreases the discharge time of C12.

During normal operation of the circuit of FIG. 2, with no control input signal applied to Q1 or a zero input, transistors Q4 and Q5 are the only transistors which are switched on. During this time capacitor C12 is discharged to a minimum voltage through transistor Q5 to ground. The output of trip circuit 16 is supplied by B+ through resistors R31, R32 and R33. During the time when a positive going pulse is supplied to the input of Q1, transistors Q4 and Q5 are switched off when transistor Q1 switches on. A negative pulse is developed on the collector Q1, driving the base of Q4 towards ground and the base of Q2 towards ground, thereby switching Q2 on and Q4 off. The reference voltage established through VR1 across R14 is developed on the emitter of Q2 and the base of Q3 when Q2 switches on, allowing Q3 to switch on, thereby providing constant current from source Q3 to charge C12. When the control input to Q1 drops to zero again, switching action is reversed with Q2 and Q3 turning off and Q4 and Q5 turning on to discharge C12 again. As long as the input signal to Q1 remains within acceptable bounds, indicating a satisfactory duty cycle, this action continues with no change in the status of Q6-Q9. If the duty cycle of the load circuit or circuit being monitored becomes excessive, the period of time that a positive pulse enables Q1 is increased, Q3 remains on for an excessive amount of time allowing C12 to charge to the point where it activates transistors Q6 through Q9. When Q9 is switched on, ground is effectively placed at the junction of R31 and resistors R32 and R33, changing the output to the load circuits and limiting the duty cycle thereto. As long as C12 is charged to a level which keeps Q6 in an on state a zero output or duty limiting output is supplied from Q9, providing load circuit protection.

A circuit for providing functions of duty cycle and pulse width limiting can be provided using typical off-the shelf components such as:

| Q1, Q4, & Q5 | 2N918 |
|---|---|
| Q2, Q3 | 2N3308 |
| Q6, Q7, Q9 | 2N2219A |
| Q8 | 2N2905A |
| VR1, VR2 | 1N746 |
| VR3 | 1N827 |
| CR1-CR6 | 1N914 |
| CR7, CR8 | 1N645 |
| R11 | 500 ohms, variable |
| R12 | 51 ohms |
| R13-R14 | 330 ohms |
| R15 | 100 ohms |
| R16 | 4700 ohms |
| R19 | 820 ohms |
| R20 | 25K ohms, variable |
| C7, C10 | 0.01 microfarads |
| C8, C11 | 4.5 microfarads |

-continued

| | |
|---|---|
| C9 | 100 picofarads |
| C12 | 0.68 microfarads |

In conjunction with a 12 volt power supply for B+, these typical circuit components will provide the duty cycle and pulse width limiting with temperature compensation as noted. While all of the resistive and capacitive components have not been set forth, it is well within the state of the art for the artisan to readily provide these values which allow appropriate switching for the transistors.

Although a particular embodiment and form of this invention has been illustrated, it will be obvious to those skilled in the art that modification may be made without departing from the scope and the spirit of the foregoing disclosure. For example, different transistors and diodes may be used operating at different supply voltages which would result in different resistors and capacitors being choosen to provide the characteristic operating voltages for the respective transistors, which is well established in the art. Therefore, it is understood that the invention is limited only by the claims appended hereto.

I claim:

1. An excessive duty cycle and pulse width limiter comprising: a drive control circuit having an input and an output, said input being adapted for receiving a control input signal, a first constant current means having an input coupled to receive the output of said drive control circuit and having an output, a second constant current means having an input adapted to receive the output of said drive control circuit and having an output coupled to the output of said first constant current means, and a trip circuit having an input adapted to receive the outputs from said constant current means and having a load output adapted for changing signal levels supplied to a load, said trip circuit comprises a duty cycle averaging element adapted to receive the outputs of said constant current means, an input amplifier responsive to signals developed across said duty cycle averaging element, a trip circuit level detector having an input responsive to said input amplifier, and an output amplifier responsive to said level detector for controlling the voltage output of said trip circuit.

2. An excessive duty cycle and pulse width limiter as set forth in claim 1 wherein said duty cycle averaging element is a capacitor, said capacitor being coupled between the input of said trip circuit and ground for developing said constant current means output signals thereacross, said input amplifier is a transistor amplifier coupled to said capacitor for responding to signals developed thereacross, said detector is a transistor coupled to said input amplifier transistor and adapted for coupling an output signal to said output amplifier in response to detected input signals for controlling signal levels coupled to a load.

3. An excessive duty cycle and pulse width limiter as set forth in claim 2 wherein said drive control circuit is a NPN transistor having the base adapted to receive control input signals, the emitter coupled to ground, and the collector coupled to provide said drive control circuit output.

4. An excessive duty cycle and pulse width limiter as set forth in claim 3 wherein each of said first and second constant current means comprises a switching transistor coupled to receive the output of said drive control means, a transistor current generator coupled to said switching transistor and coupled as said input to said trip circuit, and a variable resistance coupled to said transistor current generator and adapted for controlling current and voltage supplied therethrough.

5. An excessive duty cycle and pulse width limiter as set forth in claim 4 and further comprising first and second temperature compensating means coupled respectively to said switching transistors of said constant current means, and a third temperature compensating means coupled to said level detector for providing negative temperature compensation to said transistors for substantially regulating the current output thereof.

* * * * *